United States Patent [19]

Schultz et al.

[11] Patent Number: 4,463,355
[45] Date of Patent: Jul. 31, 1984

[54] SOLID STATE MACH/AIR SPEED INDICATOR

[75] Inventors: Elmer L. Schultz, Marion; Lee R. Fredrickson, Cedar Rapids, both of Iowa

[73] Assignee: Rockwell International Corporation, El Segundo, Calif.

[21] Appl. No.: 352,811

[22] Filed: Feb. 26, 1982

[51] Int. Cl.³ .............................................. G08B 5/36
[52] U.S. Cl. .................................. 340/971; 73/178 R; 340/754; 340/815.31; 340/963; 364/565
[58] Field of Search ............ 340/27 R, 27 SS, 27 AT, 340/870.44, 34, 815.31, 706, 754, 963, 971; 73/178 R, 180; 364/426, 433, 565

[56] References Cited

U.S. PATENT DOCUMENTS

| | | | |
|---|---|---|---|
| 3,614,728 | 10/1971 | Borrok | 340/27 R |
| 3,714,624 | 1/1973 | Story | 340/27 R |
| 3,973,168 | 8/1976 | Kearsley | 340/331 |
| 4,086,810 | 5/1978 | Ball | 340/27 AT |
| 4,112,413 | 9/1978 | Muhs | 340/27 R |
| 4,210,908 | 7/1980 | Sakakibara | 340/706 |
| 4,240,152 | 12/1980 | Duncan | 340/34 |

Primary Examiner—James J. Groody
Assistant Examiner—Michael F. Heim
Attorney, Agent, or Firm—George A. Montanye; H. Fredrick Hamann

[57] ABSTRACT

A liquid crystal display (LCD) system and technique is disclosed which enables an improved visual presentation and display of the rate of change of an aircraft parameter in an avionics system. The rate of change of the parameter is computed and its magnitude is used to generate a frequency proportional to that magnitude. The generated frequency is coupled to control circuitry which energizes a plurality of display elements to sequentially and cyclically produce a visual display of those elements at a repetition rate proportional to the generated frequency. The display elements are separated into two groups, one of which indicates the rate of change during one condition of the parameter, and the other of which indicates the rate of change during another condition of the parameter. The display elements are located in groups above and below a digital display of the aircraft parameter. In this manner, the rate of change of a given parameter can be easily perceived even with peripheral vision.

16 Claims, 2 Drawing Figures

SOLID STATE MACH/AIR SPEED INDICATOR

BACKGROUND OF THE INVENTION

The present invention relates to visual indicators, and, more particularly, to indicators which display the rate of change of a parameter in non-numerical form.

In new technology avionics systems, instrumentation and displays are becoming more complex as the need for additional functions continues to increase. The avionics systems are required to detect different parameters and to process and display those parameters in a visual form for operator perception. Until recently, many of the measurements were made by mechanical sensors and were utilized or displayed by mechanical elements including rotating dials, meter movements and other electro-mechanical or magnetic devices from which rate or trend information could be perceived. More recently, such information has been detected, processed, and displayed in digital form to improve the accuracy and reduce the space, weight, and power requirements normally associated with prior-known mechanical devices. Digital readouts, however, do not provide rate or trend information in a perceptible form for the pilot.

While digital implementations have significantly increased the ability to include additional displays in a crowded cockpit environment, the amount of displayed information is creating further problems. Each digital readout must be reviewed, sometimes repetitively, to monitor the various measured and calculated parameters. Since only a limited amount of information can be visually perceived and understood by the brain during a given time frame, the increased number of displays also increases the likelihood that information may be missed. In displaying some functions, such as the rate of change of a parameter, continuous monitoring may be necessary at certain times in order to prevent the occurrence of a hazardous situation. In such situations, the constant monitoring required detracts from the observance of other displayed parameters and can thus be as hazardous as no monitoring at all.

In electro-mechanical instruments, the rate of change of a parameter, such as the rate of change of altitude, could be obtained coincidentally from the mechanical indicator (pointer) normally providing the visual output of the measured parameter. For example, the speed of rotation of an altimeter pointer could give an observer a rough indication of the rate of change in altitude or vertical velocity. In such instances, however, great concentration is required to enable the perception of the information. In addition, the instrument fails to provide an easily discernible visual indication of the rate of change limits which would produce an unsafe condition. There is therefore a continuing need for displays which enable such visual perception of parameters, particularly rate of change parameters, which reduce pilot workload during aircraft operation.

Accordingly, the invention has been developed to overcome the shortcomings of the above known and similar techniques and to provide a visual display system and technique capable of improving visual perception of changing parameters.

SUMMARY OF THE INVENTION

The present invention provides a control system and display which enables the rate of change of a parameter, such as Gamma, Indicated Air Speed (IAS), or Mach, to be visually perceived with less concentration during aircraft operation. In one embodiment exemplifying the inventive system and technique, an aircraft system includes sensors capable of detecting the true air speed (TAS), vertical velocity (h), Mach, Indicated Air Speed, longitudinal acceleration ($A_l$) and normal acceleration ($A_n$) of the aircraft. A value, gamma ($\gamma$), where $\pm\gamma = \tan^{-1}(h/TAS)$, is continuously calculated during aircraft operation. The magnitude of $\gamma$ itself is displayed and a value for the rate of change of Gamma (as represented by normal acceleration) is coupled to a frequency generating circuit. The frequency generating circuit generates a frequency proportional to the magnitude of $A_n$ which varies from a zero frequency level to a frequency representing the upper limit of the rate of change of Gamma acceptable for aircraft operation. The generated frequency is coupled to drive a plurality of visual display elements in a sequential manner at a repetition frequency determined by the converted magnitude of $A_n$. The magnitude of aircraft longitudinal velocity is also displayed as Mach or IAS. The rate of change of longitudinal velocity, as represented by longitudinal acceleration ($A_l$) is displayed for both increasing and decreasing values of longitudinal velocity. The magnitude of $A_l$ is used to generate a frequency which varies from zero to an upper limit representing the maximum $A_l$ acceptable for aircraft operation. The frequencies representing the rate of change of Gamma, Mach and IAS are controlled so that when the upper limit of $A_l$ or $A_n$ for the aircraft is reached, the display is operated to specifically note the condition.

It is therefore a feature of the invention to provide a simple and inexpensive visual display of a changing parameter.

It is another feature of the invention to provide a visual display system and technique which provides information which can be perceived without great concentration.

It is a further feature of the invention to provide a visual display system and technique representing a changing parameter wherein a plurality of display elements are sequentially energized at a repetition rate dependent upon the magnitude of that changing parameter.

Still another feature of the invention is to provide a visual display system and technique for aircraft parameters wherein the rate of change of increasing parameters are separated and displayed apart from decreasing parameters by separate groups each including a plurality of individual display elements.

Yet another feature of the invention is to provide an aircraft display system which displays a visually perceptible numeric and non-numeric representation of the same data.

Still a further feature of the invention is to provide a visual display system and technique wherein individual sequentially illuminated display elements are configured to form an arrow or pointer indicating the rate of change of an increasing or decreasing parameter.

Another feature of the invention is to provide a visual display system and technique wherein a plurality of sequentially energized display elements are energized in a manner designed to note a predetermined parameter magnitude.

Yet a further feature of the invention is to provide a visual display in an aircraft system wherein the value as well as the rate of change of that value for Gamma and Mach or Indicated Air Speed, are simultaneously displayed by adjacent display elements.

Still another feature of the invention is to provide a visual display system and technique for aircraft parameters wherein separate groups of display elements are used to display the direction of increasing or decreasing parameters.

These and other advantages and novel features of the invention will become apparent from the following detailed description when considered with the accompanying drawings wherein:

DETAILED DESCRIPTION OF A PREFERRED EMBODIMENT

Figure 1:
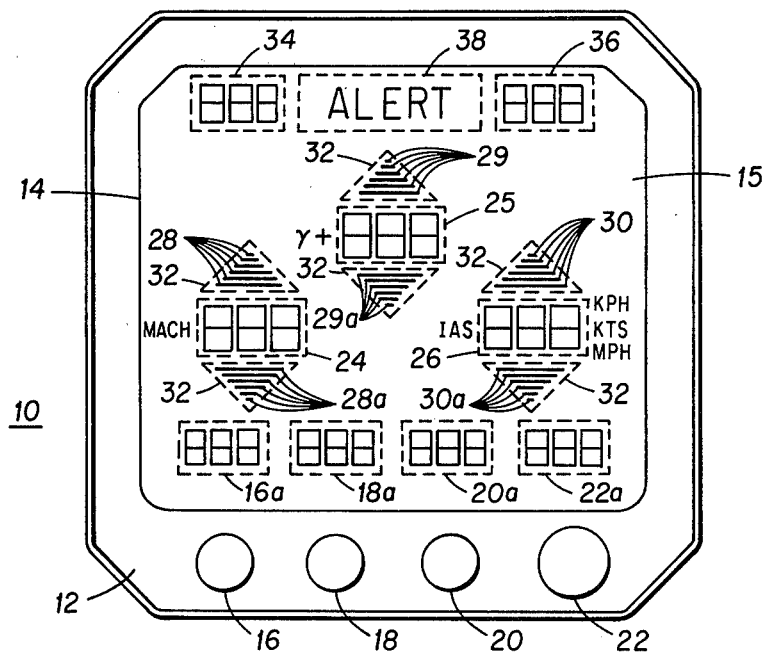
FIG. 1 is a front view of a typical aircraft instrument display utilizing the system and technique of the present invention.

Referring first to FIG. 1, there is shown the face of an aircraft instrument 10 which incorporates the visual display technique of the present invention. Generally the instrument 10 may include a mounting bracket 12 having an opening 14 which encloses the display screen 15 for presenting alpha-numeric or other information. The display 15, in the present example, may be a liquid crystal display (LCD) or any other similar display compatible with the disclosed technique. The LCD is particularly well-suited in the present system because it provides a low-cost, low power and low weight implementation with good visual characteristics. The mounting bracket 12 may include switches 16, 18, 20 and 22 which are mounted and coupled to circuitry for controlling the visual display 15 so that digital values of the parameters fixed by the switches may be displayed in corresponding positions 16a, 18a, 20a and 22a on the display 15. In the present example, the switches 16, 18, 20 and 22 may be used to display such values as take-off velocity, climb velocity, cruise velocity, landing velocity, or a variety of other parameters designed to be viewed during operation of the aircraft. Such parameters are well known, and the selection may be made in accordance with the function for the particular instruments selected. The digital characters displayed by the LCD may be generated by suitable and conventional control of the LCD by switches 16, 18, 20 and 22. As will be understood from the following description, the invention may be practiced without the display of the above or other parameters.

In the disclosed embodiment, the inventive display system and technique will be described with reference to its use in an aircraft system designed to display Gamma, Mach or Indicated Air Speed (IAS) and the rate of change of Gamma, Mach or Indicated Air Speed. It should be understood, however, that the selection of the paramaters to be displayed could be any of a wide variety in accordance with the teachings of the present invention. In this example, digital outputs for Gamma, Mach and Indicated Air Speed are provided on the display 15 adjacent one another with Gamma located between the other two. Digital outputs 24, 25 and 26 produce numeric characters representing Mach, Gamma, and Indicated Air Speed, respectively. Each of the outputs 24, 25 and 26 represents a portion on the liquid crystal display which will display a series of digital characters indicating the magnitude of Gamma, Mach or the Indicated Air Speed. The Mach magnitude is generally displayed as a decimal number (without any unit designation). Both Mach and Indicated Air Speed may be sensed by conventional transducers coupled to circuitry designed to drive the LCD and digitally display the selected Mach or Indicated Air Speed of the aircraft. It should be noted that Indicated Air Speed may be displayed by output 26 in a variety of units such as kilometers per hour, miles per hour, or knots. The specific units may be selected using a switching arrangement coupled to change the calibration in accordance with the selected units. Gamma may be displayed by output 25 in units of degrees and will include the sign of the angle as positive (+) or negative (−).

In operation, both of the parameters of Mach or Indicated Air Speed will be visually displayed. At any given time, however, the pilot will visually observe only one, depending upon the aircraft speed and altitude. Thus, from take-off to a predetermined altitude and aircraft velocity, the pilot will observe the Indicated Air Speed output 26 as his indication of aircraft velocity. Upon reaching predetermined limits of both altitude and velocity, the pilot will observe and rely on the Mach outputs 24 as his indication of aircraft velocity. The outputs 24 and 26 could alternatively be coupled and controlled by conventional switching circuitry to display only one of the Mach or IAS outputs depending on the altitude and velocity of the aircraft as described above. The details of such circuitry are unnecessary to an understanding of the present invention and will therefore not be described further. Other digital information may also be displayed by outputs 34, 36 and 38. This information may be in the form of numeric characters, alphabetic characters, or a combination of alpha-numeric characters. The particular selection of data to be displayed is not critical to the operation of the present invention and will be dependent upon the function of the instrument in the avionics system.

In accordance with the present invention, however, a non-numerical display representing rate of change of a parameter, in this case Gamma, Mach or Indicated Air Speed, is provided on the display 15. As shown in FIG. 1, the non-numeric information is visually provided by selectively energizing a plurality of individual display elements or segments 28, 28a, 29, 29a, 30 or 30a on the display 15. In the present example, display elements 28, 28a, 29, 29a, 30 and 30a are separated into six separate groups generally forming a triangular configuration as depicted by dashed lines 32. Two of the six groups 32 are associated with the Mach output 24, two with the Gamma output 25, and two with the Indicated Air Speed output 26. In each case, one of the groups is located above the digital readout 24, 25 or 26 and the other of the groups is located below the readout 24, 25 or 26 to provide a symmetrical configuration about the outputs 24, 25 or 26. As shown, each of the elements 28, 28a, 29, 29a, 30 and 30a is visually displayed as a solid horizontal line or bar when energized on the exemplary LCD display 15. The formation of a line or bar is accomplished by coupling voltages to specific areas of the LCD in a manner well known in the LCD technology. In order to form the triangular configuration 32, a plurality of elements are arranged vertically in each group 32 and are uniformly spaced with respect to one another. Each successive segment has a length less than the previous segment and is centrally positioned with respect to the previous segment. The groups 32 are configured so that the base of the triangle represented by dashed line 32 lies adjacent the digital output 24, 25 or 26 and appears to form an arrow or pointer-like display directed in an up (positive) or down (negative) direction about the outputs 24, 25 or 26.

In operation, the display elements 28 are used to indicate the rate of change of Mach when Mach is increasing (aircraft accelerating). Similarly, the display elements 28a are used to indicate the rate of change of Mach when Mach is decreasing (aircraft decelerating). Display elements 30 are used to indicate rate of change of Indicated Air Speed when the Indicated Air Speed is increasing (aircraft accelerating). Similarly, display elements 30a are used to indicate rate of change of Indicated Air Speed when the Indicated Air Speed is decreasing (aircraft decelerating). The display elements 29 are used to indicate the rate of change of vertical velocity (proportional to Gamma) when aircraft is ascending. Similarly, display elements 29a are used to indicate rate of change of vertical velocity (proportional to Gamma) when aircraft is descending. As can be understood, although the display elements 28, 28a, 29, 29a, 30 and 30a are shown to form a visual display of adjacent bar-like segments arranged in the configuration of a pointer, the same could have any shape arranged to form other desirable configurations consistent with the inventive teachings. For example, the elements 28, 28a, 29, 29a, 30 and 30a could be visually displayed as a plurality of dots, curved lines, broken lines or otherwise when energized in the manner to be subsequently described. Likewise, the non-numeric displays of groups 32 may be displayed separately or concurrently with the display of numeric data.

In accordance with the invention, the groups of elements 32 are energized in a unique manner to produce a visual display representative of the rate of change referred to above. The operation is such that each of the segments in a group 32 is sequentially energized, starting with the longest segment, to produce the bar or line display until all segments have been sequentially energized. At that time, all segments are de-energized for some time period until the same sequential energization is again initiated. This sequence is cyclically performed at a repetition rate which is proportional to the rate of change of Gamma, Mach or Indicated Air Speed. Thus, as the rate of change of Gamma, Mach or Indicated Air Speed increases, so does the repetition frequency of the sequentially energized elements of group 32. As can be understood, at zero Gamma or a constant Gamma, Mach or Indicated Air Speed, there will be no visual display of any of the segments 28, 28a, 29, 29a, 30, or 30a in the groups 32. In contrast, at some point the repetition frequency will be so great that the eyes of an observer will not be able to discern the cyclic repetition. Instead, all the segments of a group 32 will appear to be simultaneously and constantly on. In practice, the repetition frequency is controlled so that the latter referenced repetition frequency (all elements appear constantly on) occurs only when the rate of change reaches the upper limit allowed for the particular aircraft design.

Figure 2:
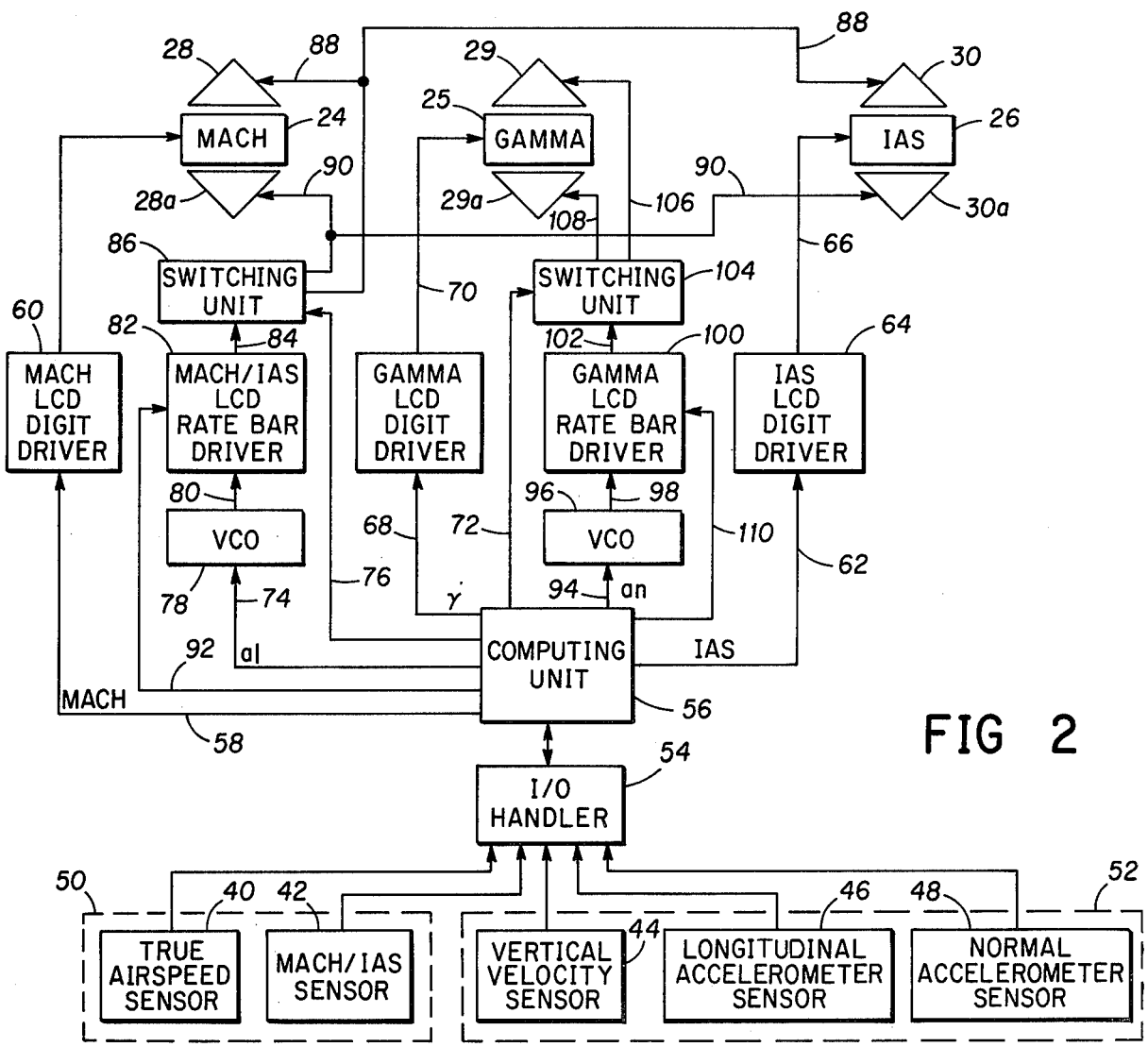
FIG. 2 is a block diagram schematically showing the control circuitry for enabling the display of a parameter and the rate of the change of that parameter in numerical and non-numerical form in one embodiment of the invention.

Referring now to FIG. 2, there is shown a schematic diagram of a system which can implement the above technique. The system includes, in the disclosed embodiment, conventional sensors which measure a plurality of aircraft parameters during flight. As shown, element 40 senses true air speed, element 42 senses Mach and IAS, element 44 senses vertical velocity, element 46 senses longitudinal acceleration, and element 48 senses normal acceleration. The sensors 40 and 42 may be individual elements or data outputs from a processing unit such as an air data computer 50. Likewise, sensors 44, 46 and 48 may be individual elements or data outputs from a processing unit such as an inertial reference system 52. It should be noted, that in defining longitudinal acceleration ($A_l$) and normal acceleration ($A_n$), a reference system is established such that a longitudinal axis extends parallel to and centrally through the fuselage of an aircraft and intersects a second axis extending parallel and centrally through the wings of an aircraft and perpendicular to the longitudinal axis. A third axis, defined as the normal axis, is established orthogonal to the longitudinal and intersecting axis. Longitudinal acceleration is then measured along the longitudinal axis while normal acceleration is measured along the normal axis.

The outputs from sensors 40, 42, 44, 46 and 48 are coupled to the conventional input-output unit 54 which acts as a control for the transfer of data from the sensors to computing unit 56. Computing unit 56 receives and processes the data provided by sensors 40, 42, 44, 46 and 48 in a manner as will be subsequently described. Unit 56 may be any conventional computer or microprocessor constructed to provide the described outputs and control functions.

Computing unit 56 receives a signal from Mach/IAS sensor 42 and converts that signal to appropriate Mach and IAS units. The computed value for Mach is then provided over line 58 to Mach LCD drive 60 which in turn provides the appropriate signal for displaying the magnitude of Mach at the LCD output 24. In a like manner, the computing unit 56 processes the signal from sensor 42 and converts the sensed signal to a value representing the magnitude of Indicated Air Speed. The magnitude of Indicated Air Speed is then provided over line 62 to IAS driver 64 which in turn provides an output signal over line 66 to drive the LCD output 26 for displaying the magnitude of IAS.

Computing unit 56 also receives the signals from sensors 40 and 44 and mathematically calculates a value for Gamma ($\gamma$) where $\gamma$ is equal to the arc tangent of the vertical velocity divided by the true air speed $$\left( \tan^{-1} \frac{h}{TAS} \right).$$

The value for Gamma is coupled over line 68 to a Gamma LCD driver, the output of which is coupled over line 70 to LCD output 25 for displaying the magnitude of Gamma. The Mach, Gamma, and IAS LCD drivers may be of any conventional construction designed to convert the signals provided by computing unit 56 to driving voltages necessary to display the respective magnitudes on each of the display outputs 24, 25 and 26.

The computing unit 56 provides an output signal on line 72 which indicates the positive or negative value of Gamma. A positive value of Gamma represents vertical velocity in an ascending direction while a negative value of Gamma represents vertical velocity in a descending direction. The magnitude of Gamma, whether positive or negative, represents the aerodynamic flight path angle of the aircraft with respect to air mass.

As was described with respect to FIG. 1, the rate of change of aircraft velocity, as represented by Mach or IAS, is displayed by elements 28, 28a, 30 and 30a. In order to drive the displays 28, 28a, 30 and 30a, computing unit 56 receives a signal from sensor 46 and converts that signal to a value representing the magnitude of longitudinal acceleration, which is provided as output on line 74. At the same time, computing unit 56 analyzes the signal from sensor 46 to determine if the signal is positive (acceleration) or negative (deceleration). An appropriate signal is provided on line 76 to represent each of these two conditions and may be simply a logic one and logic zero representing the two states, respectively. The signal from line 74 is coupled to a voltage controlled oscillator (VCO) 78. VCO 78 provides an output frequency proportional to the magnitude of $A_1$. Thus, for example, when the magnitude of $A_1$ is zero (no acceleration), the VCO 78 does not generate or provide a frequency output. However, as the magnitude of $A_1$ increases, the output of VCO 78 generates a corresponding output frequency which increases with the increase in magnitude. It should be noted, that whether the magnitude of $A_1$ represents acceleration or deceleration, the output frequency will increase with increases in that magnitude. The output from VCO 78, as provided to line 80, therefore represents the rate of change of velocity of the aircraft along the longitudinal axis of the aircraft.

The output from VCO 78 is provided over line 80 to Mach/IAS LCD rate-bar driver 82. The driver 82 may include any conventional circuitry capable of driving the display elements 28, 28a, 30 and 30a in the manner as previously described. For example, the driver 82 may include a circuit for generating a digital clock frequency proportional to the output frequency on line 80. This clock frequency could be used to drive shift registers to produce the signals necessary to drive the display elements of groups 32. The shift registers may include a plurality of serially connected shift registers, clocked by the digital clock signal. Each register may clock the next register in a conventional manner until all registers in the series have been clocked. At that time, the last register in the series resets all the registers. Each register output may then be used to drive one of the display elements of a group 32. Thus, each of the display elements in a group 32 will visually appear as its associated shift register is clocked and will remain visual until the associated shift register is reset. At that time, all display elements of a group 32 are de-energized so that none of the elements can be visually perceived, and the clocking cycle is then repeated. As the frequency of the digital clock signal increases with increases in the frequency from line 80, so too does the frequency of the sequentially activated segments of a group 32. Also, as the frequency of the digital clock signal decreases in proportion to the decrease in frequency on line 80, so too does the frequency of the sequentially activated segments of a group 32. The shift register outputs are provided over line 84 to switching unit 86. Obviously, line 84 is not intended to be limited to a single wire, but represents an output line from the shift register needed to provide the signals ultimately used to energize the LCD elements 28, 28a, 30 or 30a in a manner as previously described.

The output signals from the shift registers in unit 82 are provided over line 84 to a switching unit 86. Switching unit 86 may be any conventional transistor switching unit designed to provide the outputs on line 84 to elements 28 and 30 during acceleration, or to outputs 28a and 30a during deceleration in accordance with the signal output on line 76. Thus, when the signal on line 76 indicates acceleration, the switching circuit 86 is operated to provide the signals from line 84 to line 88 to drive display elements 28 and 30. Likewise, when the signal on line 76 indicates deceleration, the switching circuit 86 is operated to provide the signals on line 84 to line 90 to drive display elements 28a and 30a. The display elements 28 and 30 thus act as non-numeric visual displays which indicate the rate of change of velocity for increasing values of velocity (acceleration) while the display elements 28a and 30a act as non-numeric visual displays of the rate of change of velocity for decreasing values of velocity (deceleration).

A blanking output signal may also be provided by unit 56 over line 92 to unit 82 for resetting the shift registers in unit 82 when the magnitude of acceleration or deceleration is at or near zero. This would prevent any visual display of elements in a group 32 during a constant Mach or Indicated Air Speed. Thus, at zero acceleration or deceleration, none of the segments 28, 28a, 30 or 30a of a group 32 would visually appear. Conversely, at some high clock frequency dictated by the signal on line 80, the repetition rate of the sequentially activated segments of a group 32 would become so great that all segments of a group 32 would visually appear to be simultaneously and constantly on. In operation, the computing unit 56 or the drive unit 82 could calibrate the signals so that this condition occurred at a value for acceleration representing the upper limit to which the aircraft may be subjected without possible structural damage. At frequencies intermediate the two extremes, the repetition rate visually tracks the magnitude of acceleration or deceleration.

In a manner similar to that described with respect to the longitudinal acceleration, the computing unit 56 receives a signal from sensor 48 and provides a value on line 94 representing normal acceleration. The magnitude of the normal acceleration is provided as input to VCO 96 which in turn generates a frequency output in a manner similar to VCO 78. If the reference system is oriented so that the aircraft is normally considered to be in level flight, it will be understood that the normal acceleration represents a change in the vertical velocity in either the ascending or descending direction of the aircraft. Thus, when the magnitude of $A_n$ is zero, this corresponds to a level flight of the aircraft and VCO 96 will not generate or provide a frequency output. However as the magnitude of $A_n$ increases in either a positive (ascending) or negative (descending) direction, the output of the VCO 96 will generate a corresponding output frequency which increases with the increase in magnitude and corresponds to a change from level flight.

The output from VCO 96 is provided over line 98 to Gamma LCD rate-bar driver 100. Gamma rate-bar driver 100 may be similar to unit 82 and accordingly will not be discussed in great detail. The unit 100 may again include a digital frequency generating circuit designed to produce a digital clock frequency in accordance with the frequency output from line 98. This clock frequency would then again be used to drive shift registers in the same manner as referenced with respect to unit 82. The output from the shift registers would then be provided over line 102 to switching unit 104. Again, line 102 is not intended to be limited to a single wire, but would represent outputs from the shift registers needed to energize the LCD display elements 29 or 29a in the described manner.

The switching circuit 104 may again be a conventional transistor switching circuit operated to couple the output signals on line 102 to drive display elements 29 or 29a in accordance with the signal line 72. Thus, when the signal on line 72 indicates that the rate of change of Gamma is occurring in the ascending direction, switching unit 104 would be operated to couple the signals on line 102 to display elements 29. Likewise, when the signal on line 72 indicates that the rate of change of Gamma is occurring in the descending direction, switching unit 104 would be operated to couple the signals from line 102 to display elements 29a. In this manner, display elements 29 would provide an indication of the rate of change of Gamma in the ascending direction and elements 29a would indicate the rate of change of Gamma in descending direction (recognizing that Gamma and rate of change of Gamma signs can be opposite when either ascending or descending).

A blanking output signal may also be provided by unit 56 over line 110 to control the shift registers of unit 100 when the magnitude of $A_n$ is near or at zero or when the magnitude of Gamma is zero. This would again prevent any visual display of elements 29 or 29a during level flight (zero $A_n$). Conversely, at some high clock frequency from line 98, the repetition rate of the sequentially activated segments of display elements 29 or 29a would become so great that all segments of that group would visually appear to be simultaneously and constantly on. In operation, unit 56 or unit 100 could calibrate the clock frequency so that this condition occurs at a value for $A_n$ representing the upper limit of the rate of change to which the aircraft may be subjected without possible structural damage. At frequencies intermediate the two extremes, the repetition rate visually tracks the magnitude of $A_n$.

The operation of the system is evident from the previous description. During aircraft operation, sensor 42 provides the signals necessary for the display of Mach and IAS at LCD outputs 24 and 26, respectively. At the same time, sensors 40, 44, 46 and 48 are detecting their respective parameters and providing outputs to computing unit 56 for providing outputs of longitudinal acceleration, Gamma, and normal acceleration. The magnitude of Gamma is thus displayed by LCD output 25 simultaneous with the display of Mach and IAS. The magnitude of longitudinal acceleration and normal acceleration is converted by VCOs 78 and 96, respectively, to drive associated units 82 and 100. The outputs from units 82 and 100 are respectively coupled through lines 84 and 102 to associated switching units 86 and 104. When the velocity of the aircraft is increasing as evidenced by longitudinal acceleration, line 76 causes the signals produced by unit 82 to be delivered through switch 86 to line 88 for sequentially and cyclically energizing display elements (28 and 30) indicating a rate of change in the positive direction and causing the appearance of a flashing pointer in the up direction on display 15. Similarly, if the velocity of the aircraft is decreasing as evidenced by deceleration, line 76 causes switching circuit 86 to deliver signals from unit 82 over line 84 to line 90 for sequentially and cyclically energizing display elements (28a and 30a) indicating a rate of change in the negative direction (deceleration) and causing the appearance of a flashing pointer in the down direction on display 15. Again, if the longitudinal acceleration is at or near zero (constant velocity) the blanking signal on line 92 resets the shift registers of unit 82 so that no visual display of the segments 28, 28a, 30 or 30a will appear on the display 15.

In a similar manner, the sensors 40 and 44 provide signals to computing unit 56 which enables the calculation of Gamma and the display of Gamma by LCD output 25. At the same time, sensor 48 provides a signal to computing unit 56 which enables the development of a signal representing normal acceleration on line 94. When the normal acceleration is occurring in a positive (aircraft ascending) direction, line 72 causes switching unit 104 to deliver the signals on line 102 to line 106 for sequentially and cyclically energizing display elements 29 indicating a rate of change in Gamma for aircraft ascent and causing the appearance of a flashing pointer in the up direction on display 15. Conversely, when the rate of change of Gamma is occurring in the negative (aircraft descending) direction, line 72 causes switching unit 104 to deliver signals from line 102 to line 108 for sequentially and cyclically energizing display elements 29a indicating a rate of change in Gamma for aircraft descent, and causing the appearance of a flashing pointer in the down direction on display 15. If the magnitude or the rate of change of Gamma is zero, the blanking signal on line 110 resets the shift registers of unit 100 and no visual display of the segments 29 or 29a will appear on the display 15.

As can be seen by the above disclosure, the present invention provides a display system and technique which enable a parameter (velocity or Gamma) and its rate of change to be easily perceived with minimal concentration. The flashing display caused by sequential and cyclic activation of individual display elements in a group configuration enables easy peripheral vision with little visual concentration. The perception of repetition frequency presented by the display provides a rough approximation of the rate of change of the given parameter. An operator or pilot is thus able to expand his field of view for monitoring other flight instruments. If a hazardous condition is approached, as evidenced by the rapid increase in the repetition frequency, action can be taken without detracting from the continual monitoring of other aircraft parameters. By positioning the individual elements in groups above and below the digital representations of the velocity and Gamma, an operator or pilot is able to extract additional information concerning the change in velocity or Gamma without significant mental concentration. By way of example, when the display elements 28a and 30a are energized simultaneous with display elements 29a, the rate of change of Gamma is occurring in a negative direction and the velocity is decreasing. This condition, for example, may occur during wind gusts and is an indication of a dangerous condition which must be corrected by increasing aircraft velocity. All of these are advantages that are not shown or taught by display systems of the prior art.

Although only one embodiment of the invention has been specifically described, it is apparent that other elements, configurations, and modes of operation may be employed. For example, as described above, the bar displays on the LCD are intended to be sequentially energized with each bar remaining in view until all bars in the sequence have been energized. At that time all of the individual elements are de-energized and the sequential activation repeats with the same sequence occurring in a cyclic manner at different frequencies depending on the magnitude of $A_1$ or $A_n$. However, the same effect can be obtained by sequentially energizing the individual display elements in a cyclic manner but in such a way that the activation of the next sequential element does not occur until the deactivation of the previous sequential element. This would result in a visual effect wherein it would appear that the bar is moved or stepped from one level to the next until such time as the frequency of repetition approaches the limit where all bars appear activated at the same time.

Alternatively, the system does not have to be operated so that as the frequency of repetition approaches the upper limit of the parameter acceptable to the aircraft, the display elements of groups 32 appear simultaneously on. The system could just as well be operated so that once the frequency from VCO 78 or 96 reaches a predetermined level, the units 82 or 100 cause all of the elements in a group 32 to simultaneously flash thereby indicating that the predetermined limit for the parameter has been reached. Any other technique for distinguishing the display elements of group 32 after the predetermined parameter limit has been reached would also be acceptable.

It should be noted that while the technique has been described with reference to an aircraft system and specific parameters (velocity and Gamma) within that system, the inventive technique is equally applicable to other parameters (e.g., altitude) and other systems (e.g., automobile). It is likewise apparent that other displays, such as LED or cathode ray tube, could be employed in lieu of the LCD described herein. Obviously, many other modifications and variations of the present invention are possible in light of the above teachings. It is therefore to be understood that within the scope of the appended claims the invention may be practiced otherwise than as specifically described.

What is claimed is:

1. In a system for calculating and displaying a parameter, the improvement comprising:
   means for providing a signal representing the magnitude of the rate of change of the parameter;
   a first display group having a plurality of individual display elements arranged in a predetermined display pattern;
   a second display group having a plurality of individual display elements arranged in a predetermined display pattern; and
   means for causing said elements of said first display group to visually appear in a sequential and cyclic manner at a repetition rate proportional to the magnitude of the rate of change of said parameter during a first condition of said parameter and for causing said elements of said second display group to visually appear in a sequential and cyclic manner at a repetition rate proportional to the magnitude of the rate of change of said parameter ducing a second condition of said parameter.

2. The system of claim 1 wherein said means for causing causes said individual elements to visually appear in a different form in response to a predetermined magnitude of the rate of change of said parameter.

3. The system of claim 2 wherein said means for causing causes said individual elements to visually appear at a repetition rate such that all elements appear to be simultaneously and constantly in sight when the magnitude of the rate of change of said parameter reaches said predetermined magnitude.

4. A visual display system comprising:
   means for providing a signal representing the magnitude of the rate of change of a parameter;
   a first display group having a plurality of display elements arranged in a predetermined pattern each of which visually appears when energized;
   a second display group having a plurality of display elements arranged in a predetermined pattern each of which visually appears when energized; and
   means for sequentially and cyclically energizing the display elements of said first group at a repetition rate proportional to the magnitude of said rate of change during a first condition of said parameter and sequentially and cyclically energizing the display elements of said second group at a repetition rate proportional to the magnitude of said rate of change during a second condition of said parameter.

5. The system of claim 4 wherein said display elements of each group are configured to visually appear as a series of adjacent bars uniformly spaced from one another to form said predetermined patterns.

6. The system of claim 5 wherein said bars of each group are vertically aligned and dimensioned to have a length such that each successive bar in the group is shorter than the next previous bar so that the group as a whole when energized appears to form a triangular pattern representing an arrow or pointer.

7. The system of claim 4 further including a means for displaying the magnitude of said parameter and further wherein said first and second groups are positioned with respect to the display of said paramter so that said first group is above the parameter display and said second group is below the parameter display.

8. The system of claim 7 wherein said means for energizing energizes said display elements of each group sequentially starting with the closest element adjacent the parameter display.

9. An aircraft display system comprising:
   means for providing at least one parameter related to aircraft operation;
   display means including at least first and second display groups each having a plurality of display elements arranged in a predetermined pattern wherein each of said elements can be visually perceived when energized; and
   means for sequentially and cyclically energizing the display elements of said first display group at a repetition rate proportional to the magnitude of the rate of change of said at least one parameter during a first condition of said at least one parameter and for sequentially and cyclically energizing the display elements of said second display group at a repetition rate proportional to the magnitude of the rate of change of said at least one parameter during a second condition of said at least one parameter.

10. The system of claim 9 wherein said display means includes means for displaying the magnitude of said one parameter and wherein at least one display group is positioned adjacent the display of the magnitude of said at least one parameter.

11. The system of claim 10 wherein said means for energizing energizes said first said group when the magnitude of said at least one parameter is increasing and energizes said second group when the magnitude of said at least one parameter is decreasing.

12. The system of claim 10 wherein said means for energizing energizes said first group when said at least one parameter is changing in a positive direction and energizes said second group when said parameter is changing in a negative direction.

13. An aircraft display system comprising:
means for providing the magnitude of at least one parameter;
means for providing a magnitude of the rate of change of said at least one parameter;
means for providing at least one digital display of the magnitude of said at least one parameter;
display means including at least one first group and at least one second group of display elements each arranged in a predetermined pattern wherein each of said elements can be visually perceived when energized, said at least one first group being vertically positioned adjacent and above said at least one digital display, and said at least one second group being vertically positioned adjacent and below said at least one digital display; and
means for sequentially and cyclically energizing the display elements of said at least one first group at a repetition rate proportional to the magnitude of the rate of change of said at least one parameter during a first condition of said at least one parameter and for sequentially and cyclically energizing the display elements of said at least one second group at a repetition rate proportional to the rate of change of said at least one parameter during a second condition of said at least one parameter.

14. The system of claim 13 wherein said means for providing at least one parameter includes means for providing the magnitude of velocity and Gamma ($\gamma$) of an aircraft, said means for providing a magnitude of the rate of change includes means for providing a magnitude proportional to the rate of change of Gamma and a magnitude proportional to the rate of change of velocity, said means for providing said at least one digital display of said magnitude includes a first digital display for velocity and a second digital display for Gamma and wherein a first group of display elements is associated with and positioned vertically above each of said first and second digital displays and a second group of display elements is associated with and positioned vertically below each of said digital displays, and further wherein said means for energizing includes first means for energizing said first group associated with velocity during increasing values of velocity and energizing said second group associated with velocity during decreasing values of velocity and second means for energizing said first group associated with Gamma during changes of Gamma in a positive direction and energizing said second group associated with Gamma during changes of Gamma in a negative direction.

15. The system of claim 14 wherein said means for energizing energizes said groups at a repetition rate which increases with an increase in the magnitude of the rate of change and wherein said means for energizing causes a group to visually appear in a predetermined configuration when a predetermined magnitude of the associated rate of change has been reached.

16. A technique for providing a visual display of the rate of change of a parameter comprising:
positioning a series of individual display elements in a first group to form a predetermined configuration so that each display element visually appears when energized;
positioning a series of of individual display elements in a second group to from a predetermined configuration so that each display element of said second group visually appears when energized;
calculating the rate of change of a selected parameter and providing an output signal indicative of the magnitude of that rate of change during first and second conditions of said parameter;
sequentially and cyclically energizing said individual display elements of said first group at a repetition rate proportional to the magnitude of said rate of change to form a visual display having a frequency of visual repetition indicative of said rate of change during said first condition of said parameter; and
sequentially and cyclically energizing said individual display elements of said second group at a repetition rate proportional to the magnitude of said rate of change to form a visual display having a frequency of visual repetition indicative of said rate of change during said second condition of said parameter.

* * * * *